United States Patent
Park

(10) Patent No.: US 7,378,693 B2
(45) Date of Patent: May 27, 2008

(54) CMOS IMAGE DEVICE WITH POLYSILICON CONTACT STUDS

(75) Inventor: Young-Hoon Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 284 days.

(21) Appl. No.: 11/055,676

(22) Filed: Feb. 10, 2005

(65) Prior Publication Data

US 2005/0199922 A1 Sep. 15, 2005

(30) Foreign Application Priority Data

Mar. 10, 2004 (KR) .................. 10-2004-0016097

(51) Int. Cl.
*H01L 31/062* (2006.01)
*H01L 31/113* (2006.01)
(52) U.S. Cl. .................. 257/291; 257/292; 257/293; 257/E27.13
(58) Field of Classification Search ............ 257/233, 257/239, 288, 290–293, 443, 444, 446, E27.13, 257/E27.131, E27.133
See application file for complete search history.

(56) References Cited

U.S. PATENT DOCUMENTS

| 6,017,813 | A | * | 1/2000 | Kuo | 438/618 |
| 6,194,258 | B1 | | 2/2001 | Wuu | 438/200 |
| 6,639,261 | B2 | * | 10/2003 | Rhodes | 257/291 |
| 2004/0089883 | A1 | * | 5/2004 | Kim | 257/222 |
| 2006/0214201 | A1 | * | 9/2006 | Rhodes | 257/292 |

FOREIGN PATENT DOCUMENTS

| JP | 2000133792 | 5/2000 |
| JP | 2000340780 | 12/2000 |

* cited by examiner

*Primary Examiner*—Thien F Tran
(74) *Attorney, Agent, or Firm*—F. Chau & Associates, LLC

(57) ABSTRACT

A CMOS image device comprises a pixel array region including a photo diode region, a floating diffusion region, and at least one MOS transistor having a gate and a junction region, a CMOS logic region disposed around the pixel array region, the CMOS logic region including a plurality of nMOS transistors and pMOS transistors, and contact studs formed on the floating diffusion region and the junction region in the pixel array region, the contact studs comprising impurity-doped polysilicon layers.

10 Claims, 8 Drawing Sheets

CMOS IMAGE DEVICE WITH POLYSILICON CONTACT STUDS

CROSS REFERENCE TO RELATED APPLICATION

This application claims priority to Korean Patent Application No. 2004-16097, filed on Mar. 10, 2004, which is incorporated herein in its entirety by reference.

1. Technical Field

The present disclosure relates to a complementary metal oxide semiconductor (CMOS) image device and a method of fabricating the same, and more particularly, to a CMOS image device including an active pixel region and a CMOS logic region, and a method of fabricating the same.

2. Discussion of Related Art

Generally, an image device converts optical images into electrical signals. The image device includes a charge coupled device (CCD) and a CMOS image sensor. The CCD includes a plurality of MOS capacitors operated by moving charges (i.e., carriers). The moving charges are generated by light. The CMOS image sensor is operated by a plurality of unit pixels. A CMOS circuit controls output signals of the unit pixel.

Generally, fabrication processes and an operation of the CCD are complicated, and the operation of the CCD requires high power consumption. Since a signal processing circuit cannot be integrated in a CCD chip, one-chip structure is generally not available for the CCD chip. The CMOS image sensor using conventional CMOS fabrication technology is studied.

As disclosed in U.S. Pat. No. 5,904,493 and No. 6,195,259, the CMOS image sensor includes a pixel region for capturing images and a CMOS logic region for controlling output signals from the pixel region. The pixel region includes a photo diode and MOS transistors. The CMOS logic region includes a plurality of CMOS transistors. The pixel region and the CMOS logic region can be integrated on one substrate as described above. Elements, such as transistors formed in the pixel region and the CMOS logic region can be concurrently formed.

Conductive regions formed in the pixel region and the CMOS logic region are electrically connected to a metal interconnection which is supplied with exterior signals. The conductive regions include a photo diode region, a gate of a transistor, and source and drain regions. A medium connecting each conductive region to the metal interconnections employs, for example, a tungsten plug formed of a titanium/titanium nitride layer/tungsten layer. Other kinds of metal plugs are also available. Using a metal plug, such as a tungsten plug, improves signal transfer characteristics in the CMOS logic region.

However, metal plug residue may move into the photo diode region of the pixel region during the formation of the metal plugs. Typically, the metal plug comprises an opaque metal. When the opaque metal is collected in the photo diode region, the opaque metal may cause a dot defect-shaped "dark defect" on the output image of the image device and/or a "dark noise" due to the leakage of charges. As a result, the image quality characteristics of the CMOS image device can be deteriorated.

SUMMARY OF THE INVENTION

In an exemplary embodiment of the present invention, a CMOS image device comprises a pixel array region including a photo diode region, a floating diffusion region, and at least one MOS transistor having a gate and a junction region, a CMOS logic region disposed around the pixel array region, the CMOS logic region including a plurality of nMOS transistors and pMOS transistors, and contact studs formed on the floating diffusion region and the junction region in the pixel array region, the contact studs comprising impurity-doped polysilicon layers.

In another exemplary embodiment of the present invention, a CMOS image device comprises a pixel array region including a photo diode region for sensing light, a transfer transistor for transferring charges generated in the photo diode region, a reset transistor for periodically resetting a floating diffusion region storing transferred charges, and a source follower having at least one MOS transistor for buffering a signal according to charges filled in the floating diffusion region, a CMOS logic region disposed around the pixel array region, the CMOS logic region including nMOS transistors and pMOS transistors, contact studs formed on the floating diffusion region, a junction region of the transfer transistor, a junction region of the reset transistor, and a junction region of the MOS transistor of the source follower in the pixel array region, the contact stud being formed of a doped polysilicon layer, and contact studs formed on a junction region of the nMOS transistor and a junction region of the pMOS transistor in the CMOS logic region, the contact stud being formed of a metal.

In still another exemplary embodiment of the present invention, a CMOS image device comprises a pixel array region including a photo diode region and at least one nMOS transistor, a CMOS logic region disposed around the pixel array region, the CMOS logic region including an nMOS transistor and a pMOS transistor, a first contact stud formed on a junction region of the nMOS transistor, the first contact stud formed of an impurity-doped polysilicon layer, and a second contact stud formed on a junction region of the pMOS transistor, the second contact stud formed of a metal.

These and other exemplary embodiments, aspects, features and advantages of the present invention will become apparent from the following detailed description of exemplary embodiments, which is to be read in connection with the accompanying drawings.

DETAILED DESCRIPTION OF EXEMPLARY EMBODIMENTS

Exemplary embodiments of the present invention will now be described more fully hereinafter below with reference to the accompanying drawings. This invention may, however, be embodied in different forms and should not be construed as limited to the exemplary embodiments set forth herein. Rather, these exemplary embodiments are provided so that this disclosure will be through and complete, and will fully convey the scope of the invention to those skilled in the art.

Figure 1:
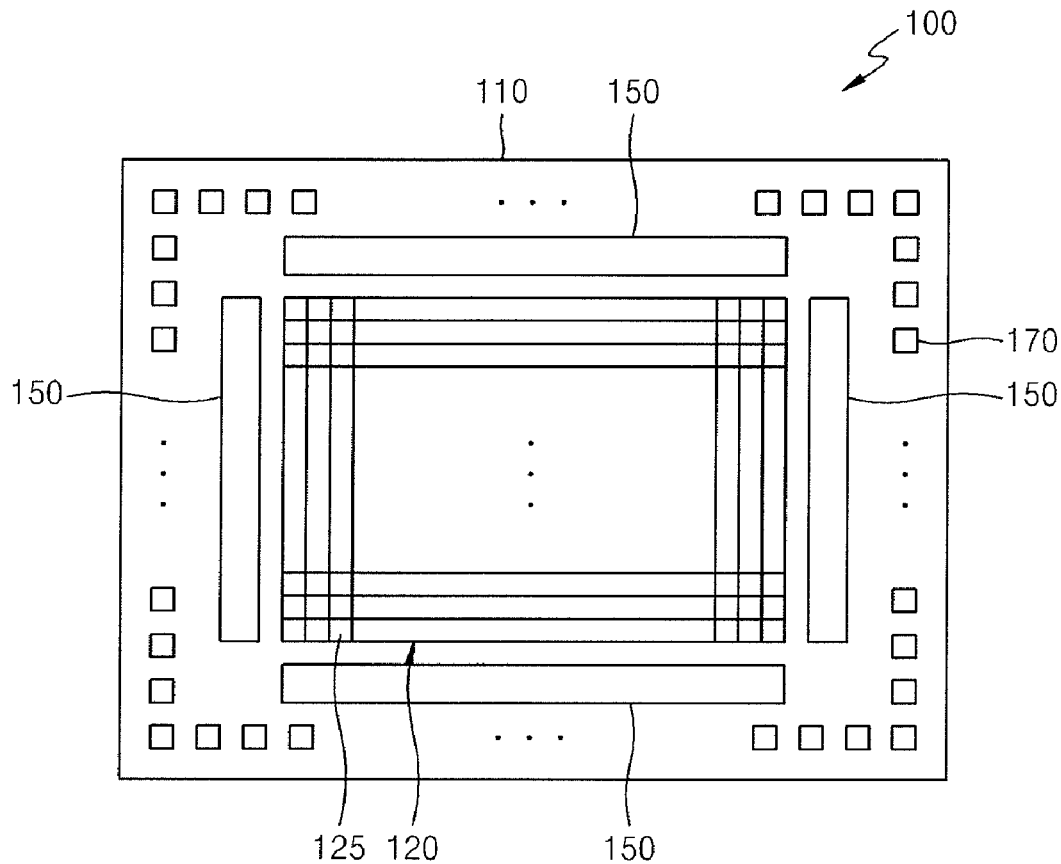
FIG. 1 is a schematic diagram of a conventional CMOS image device.

FIG. 1 is a schematic diagram of a conventional CMOS image device. As shown in FIG. 1, a CMOS image device 100 includes a pixel array region 120 and a CMOS logic region 150, which are formed on a circuit substrate 110. The pixel array region 120 includes a plurality of unit pixels 125, which are aligned in a matrix shape.

Figure 2:
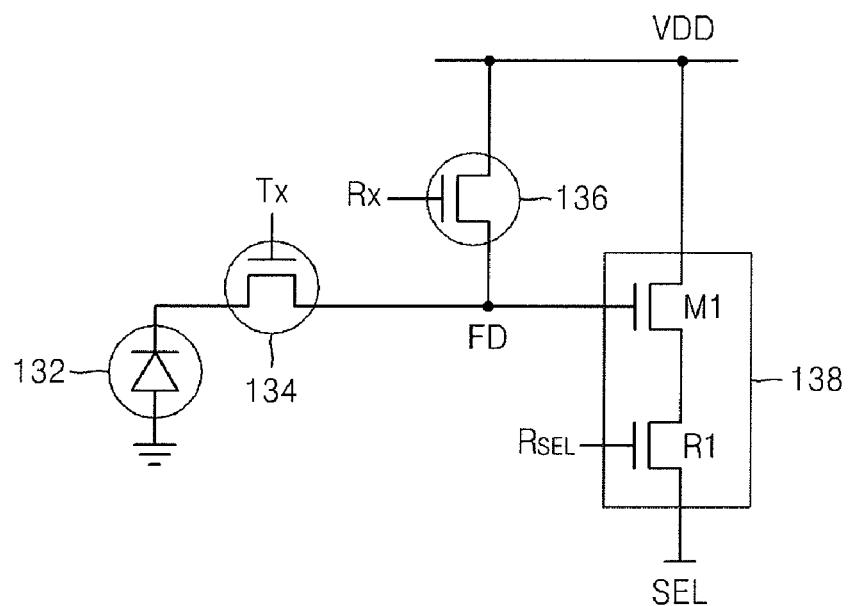
FIG. 2 is a circuit diagram of a unit pixel of a conventional CMOS image device.

As shown in FIG. 2, the unit pixel 125 includes a photo diode 132, a transfer transistor 134, a reset transistor 136, and a source follower 138. The unit pixel 125 senses light. The transfer transistor 134 transfers the charges generated by the photo diode 132. The reset transistor 136 periodically resets a floating diffusion region FD which stores the transferred charges. The source follower 138 buffers a signal according to the charges stored in the floating diffusion region FD. The source follower 138 includes two MOS transistors M1 and R1, which are connected in series.

Figure 3:
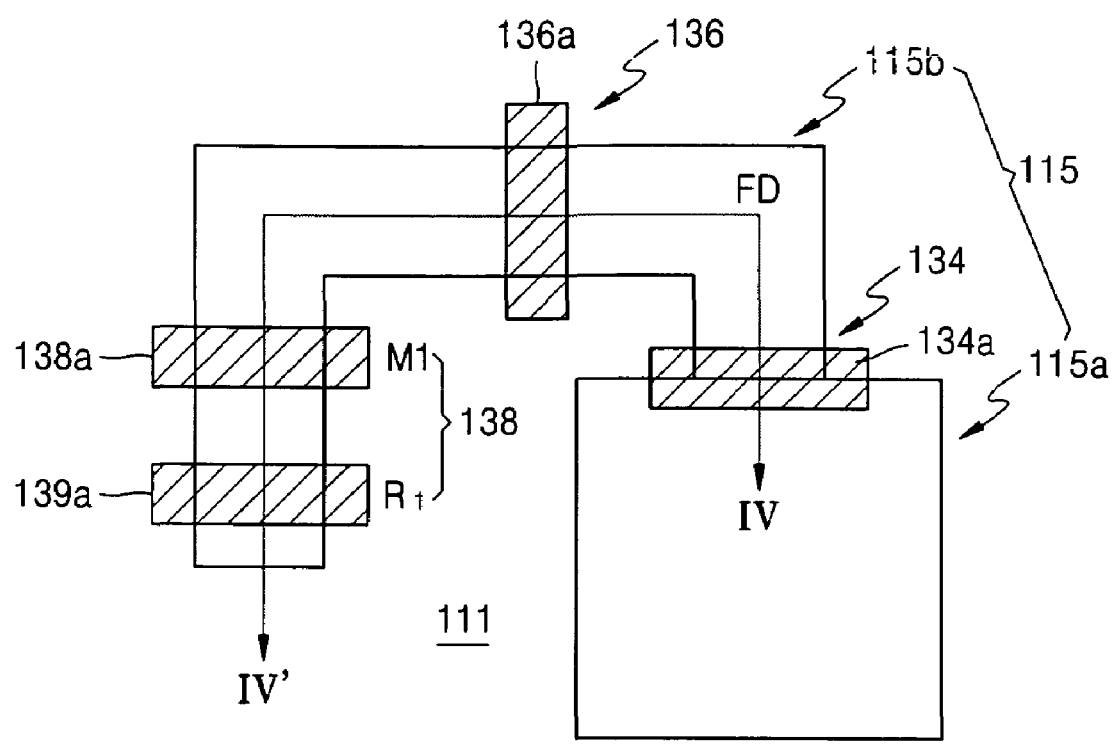
FIG. 3 is a plan view of the unit pixel of FIG. 2 integrated on a semiconductor substrate.

The pixel array region 120 configured as above is integrated on the semiconductor substrate 110 as shown in FIG. 3. As shown in FIG. 3, an active region 115 is formed on the semiconductor substrate 110. The active region 115 comprises a photo diode region 115a and a transistor region 115b. The photo diode region 115a can be formed in a shape, for example, of a rectangle and disposed on a unit pixel region of the semiconductor substrate 110. The transistor region 115b is positioned to contact one side of the photo diode region 115a, and formed linearly with at least one section thereof being bent.

A gate electrode 134a of the transfer transistor 134 is disposed between the photo diode region 115a and the transistor region 115b. On the transistor region 115b, a gate electrode 136a of the reset transistor 136, and gate electrodes 138a, 139a of the transistors M1 and R1 of the source follower 138 are disposed. Impurities are injected into the active regions 115a, 115b on both sides of the gate electrodes 134a, 136a, 138a, 139a to form a photo diode region 132, a floating diffusion region FD, and a junction region of a transistor. Even though not depicted in the drawing, each of the gate electrodes 134a, 136a, 138a, 139a, the floating diffusion region FD, and the junction regions are electrically connected via a metal interconnection. Exterior signals are applied to the metal connection which contacts studs (not shown).

The contact stud contacted with the floating diffusion region FD, and the contact stud contacted with a junction region of the MOS transistors can be formed of impurity-doped polysilicon. The CMOS logic regions 150 are formed around the respective sides of the pixel array region 120. The CMOS logic region 150 comprises a plurality of CMOS transistors (not shown). The CMOS logic region 150 may apply a signal to each pixel of the pixel array region 120, or may control output signals.

Figure 4:
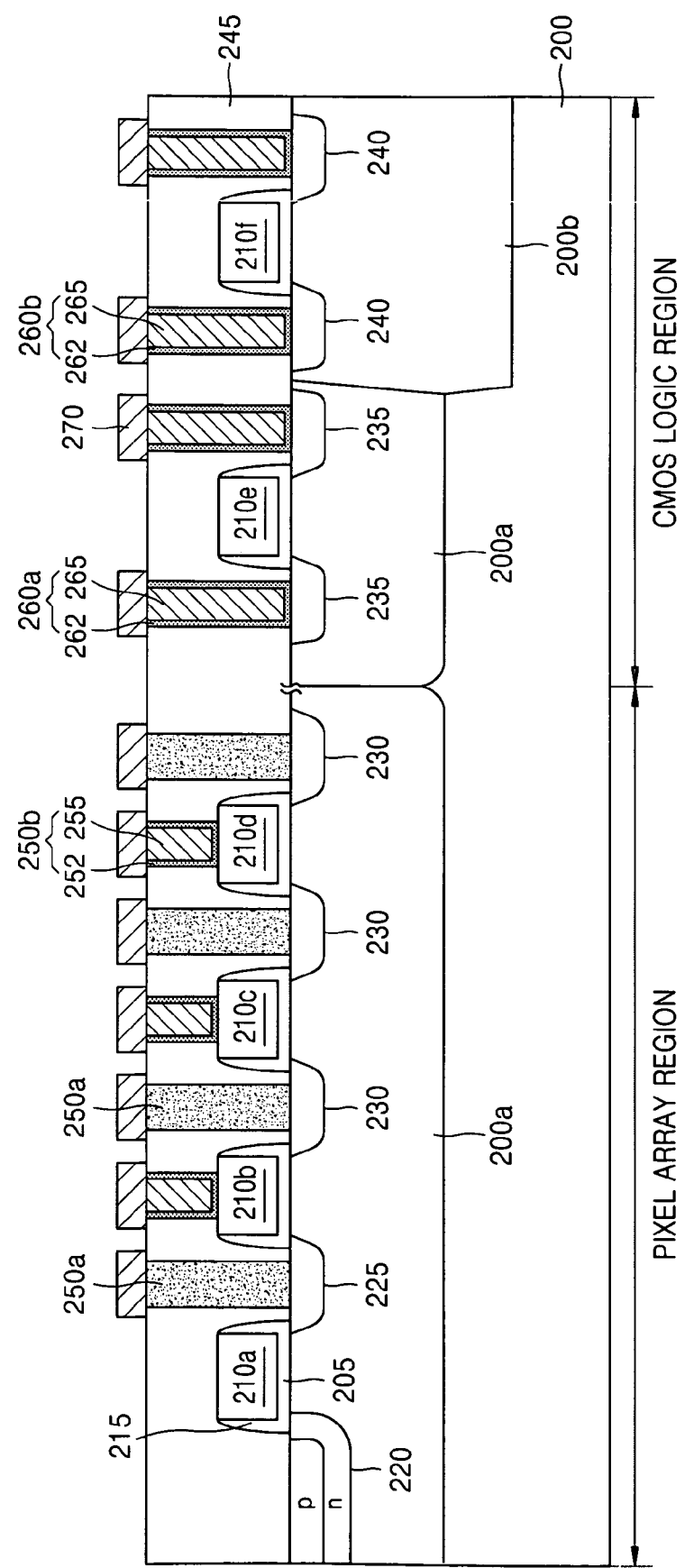
FIG. 4 is a sectional view of a CMOS image device according to an exemplary embodiment of the present invention.

FIG. 4 is a sectional view of a semiconductor substrate on which a pixel array region and a CMOS logic region are integrated according to one exemplary embodiment of the present invention. The pixel array region, as shown in FIG. 4, is shown in a section taken along a line of IV-IV' of FIG. 3. As shown in FIG. 4, a pixel array region, a CMOS logic region, and active regions of the pixel array region and the CMOS logic region are formed on a semiconductor substrate 200 using an isolation layer (not shown). Wells 200a, 200b are formed inside the semiconductor substrate 200. The pixel array region typically includes an nMOS transistor. Thus, the p-well 200a is formed in the pixel array region. The CMOS logic region includes an nMOS transistor and a pMOS transistor integrated therein. Thus, the p-well 200a and the n-well 200b are formed in the CMOS logic region.

On the pixel array region, a gate electrode 210a of the transfer transistor, a gate electrode 210b of the reset transistor, and gate electrodes 210c, 210d of transistors of the source follower are formed. On the CMOS logic region, a gate electrode 210e of the nMOS transistor and a gate electrode 210f of the pMOS transistor are formed. A gate oxide layer 205 is interposed between each of the gate electrodes 210a~210f and the semiconductor substrate 200. An insulating spacer 215 is formed on both sidewalls of the gate electrodes 210a~210f. The gate electrodes 210a~210f can be formed through the same process.

A photo diode region 220, which comprises a p-type impurity region and an n-type impurity region, is formed in the active region on one side of the gate electrode 210a of the transfer transistor. A floating diffusion region 225, which is formed of n-type impurities, is formed in the active region on the opposite side of the gate electrode 210a of the transfer transistor. Junction regions 230, which are formed of n-type impurities, are formed in the active region on both sides of each of the gate electrodes 210b~210d formed on a surface of the pixel array region.

In the CMOS logic region, n-type impurities of junction regions 235 are formed on both sides of the gate electrode 210e formed on the p-well. P-typed impurities of junction regions 240 are formed on both sides of the gate electrode 210f of the pMOS transistor formed on the n-well. The floating diffusion region 225 and n-type junction regions 230, which are formed in the pixel array region, and n-type junction regions 235, which are formed in the CMOS logic region, can be formed through a same process. In one exemplary embodiment of the present invention, the n-type junction regions 225, 230, 235 and the p-type junction region 240 can be formed through a different process. For example, the processing sequences for forming the n-type junction regions 225, 230, 235 and the p-type junction region 240 can be changed.

Then, an interlayer insulating layer 245 is formed on the semiconductor substrate 200, on which the gate electrodes 210a~210f, the junction regions 230, 235, 240, the floating diffusion region 225 and the photo diode region 220 are formed.

Contact studs 250a, 250b, 260a, 260b are formed inside the interlayer insulating layer 245, and electrically connected to the gate electrodes 210a~210d. The junction regions 230, 235, and the floating diffusion region 225, and metal interconnections 270 are formed on the interlayer insulating layer 245, and electrically connected to the contact studs 250a, 250b, 260a, 260b.

In one exemplary embodiment of the present invention, the contact studs 250a, which contact the floating diffusion region 225 and the junction region 230 in the pixel array region 120 (FIG. 1), are formed of impurity-doped polysilicon. The impurity-doped polysilicon prevents the residue of metal constituents from being remained. The contact stud 250b, formed in the pixel array region, and the contact studs 260a, 260b formed in the CMOS logic region 150 (FIG. 1) are made of a metal. Since the contact studs 250a, which contact the floating diffusion region 225 and the junction region 230 in the pixel array region, are formed of impurity-doped polysilicon layers, metal residue can be prevented from being introduced into the photo diode region 220 adjacent to the floating diffusion region 225. Thus, a dark defect and a dark current can be reduced. The metal is employed for the conductive regions such as the contact stud 250b contacted with the gate electrodes 210b, 210c, 210d in the pixel array region, and all of the contact studs 260 formed in the CMOS logic region. Thus, the maintenance of the signal transfer characteristics can be improved. A metal may not be employed for conductive regions such as the floating region 225 and the junction region 230. The contact studs 250b, 260a, 260b, made of a metal, may include barrier metal layers 252, 262, which are formed on the inner sidewalls of the contact holes. The barrier metal layers 252, 262 can be made of titanium/titanium nitride layers. Tungsten metal layers 255, 265 may fill the contact holes.

Figure 5:
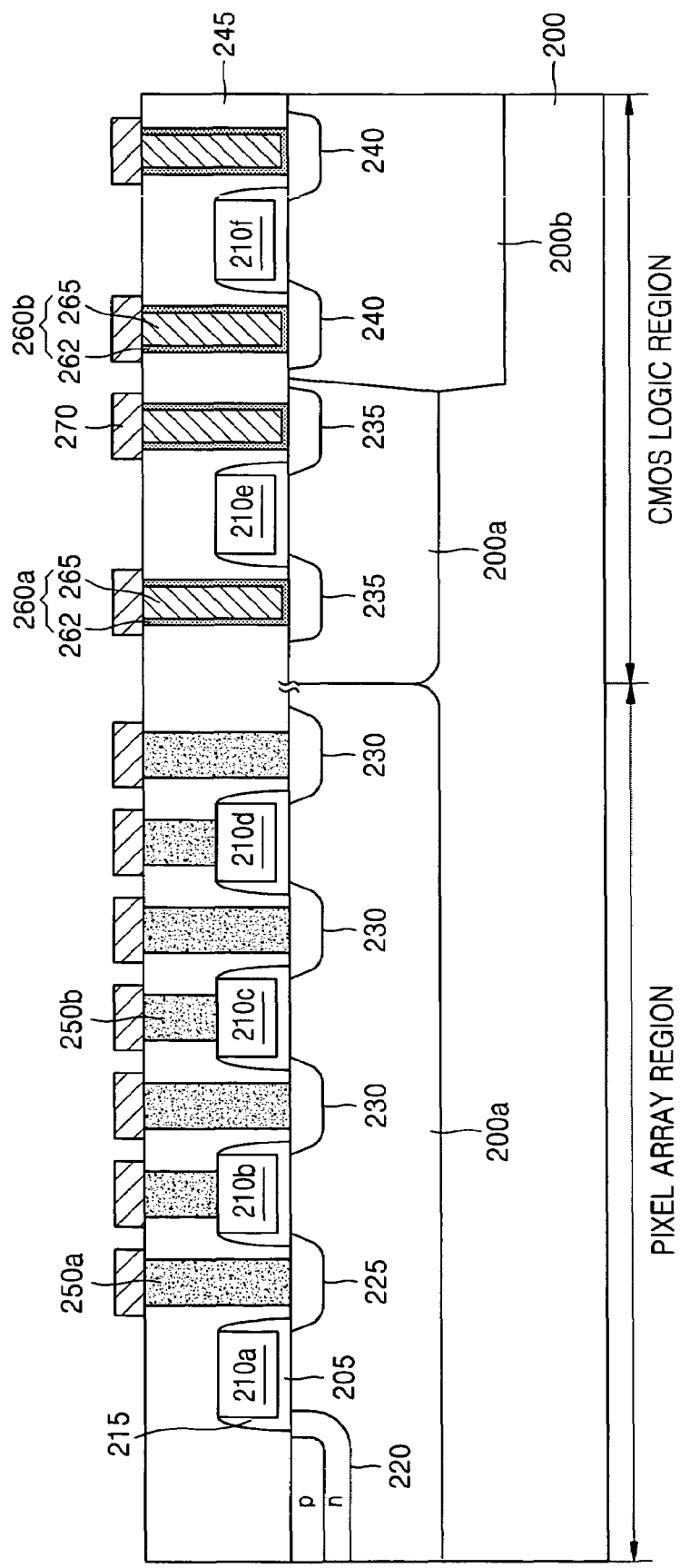
FIGS. 5 to 9 are sectional views of a CMOS image device according to exemplary embodiments of the present invention.

In another exemplary embodiment of the present invention, as shown in FIG. 5, the contact studs 250a, 250b formed in the pixel array region may be formed of impurity-doped polysilicon layers. The contact studs 260a, 260b formed in the CMOS logic region may be formed of a metal. The contact studs 260a, 260b may include a barrier metal layer 262 and a tungsten metal layer 265 as described above.

Figure 6:
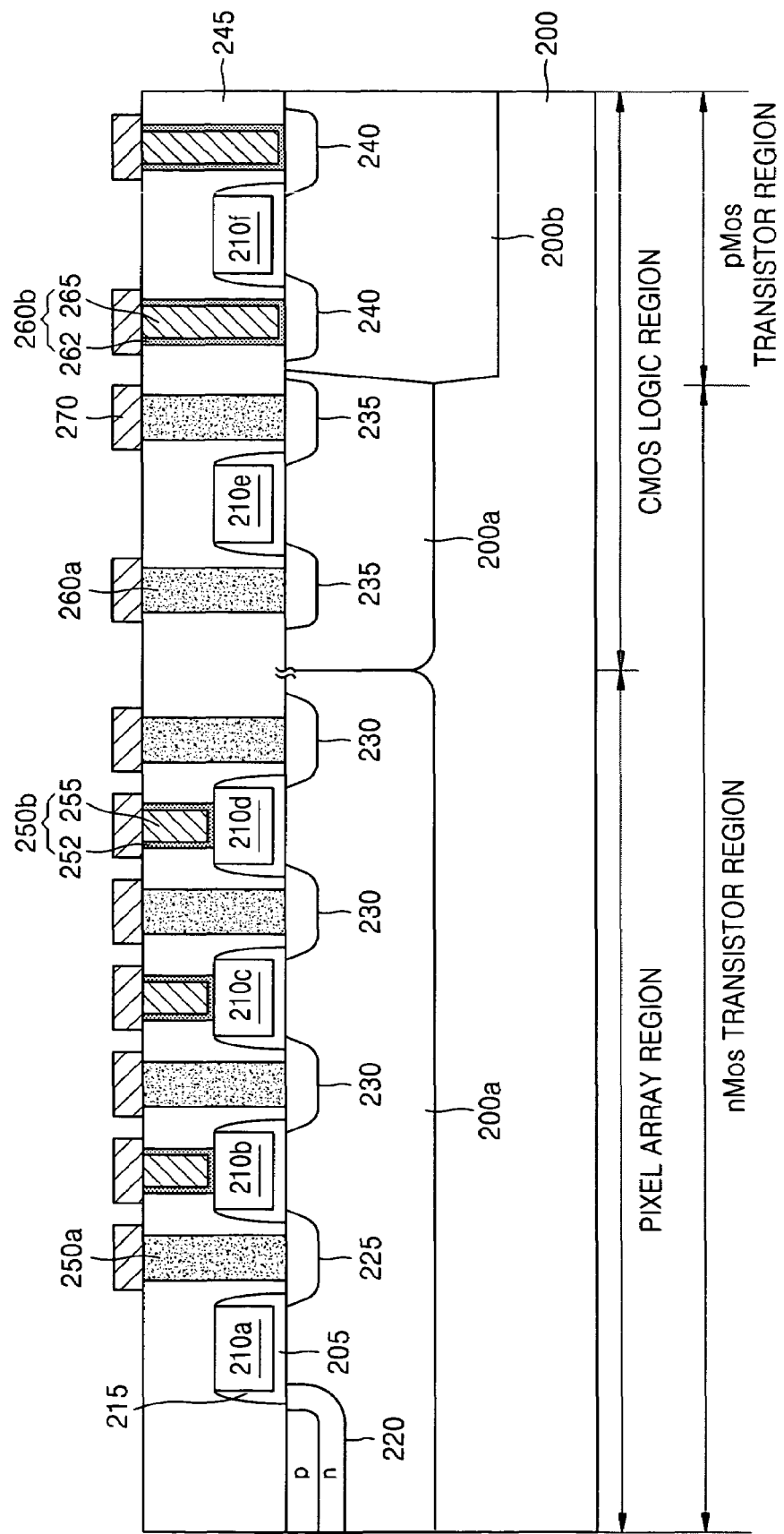

In still another exemplary embodiment of the present invention, as shown in FIG. 6, the contact studs 250a, 260a, which are formed on the floating diffusion region 225 and the junction regions 230, 235 of the all nMOS transistors, are formed of doped polysilicon layers. The contact stud 260b formed on the junction region 240 of the pMOS transistor, and the contact studs 250b formed on the gate electrodes 210b, 210c, 210d of the pixel array region may be formed of a metal. The impurities injected to improve a conductivity of the polysilicon layer are typically n-type impurities such as $POCl_3$. When the polysilicon contact stud doped with n-type impurities contacts with the p-type junction region, a pn-junction is generated. As a result, an ohmic contact is not formed. Since the junction region 240 and the contact studs are not electrically connected, doped polysilicon contact studs are not formed on the junction region 240 of the pMOS transistor.

Figure 7:
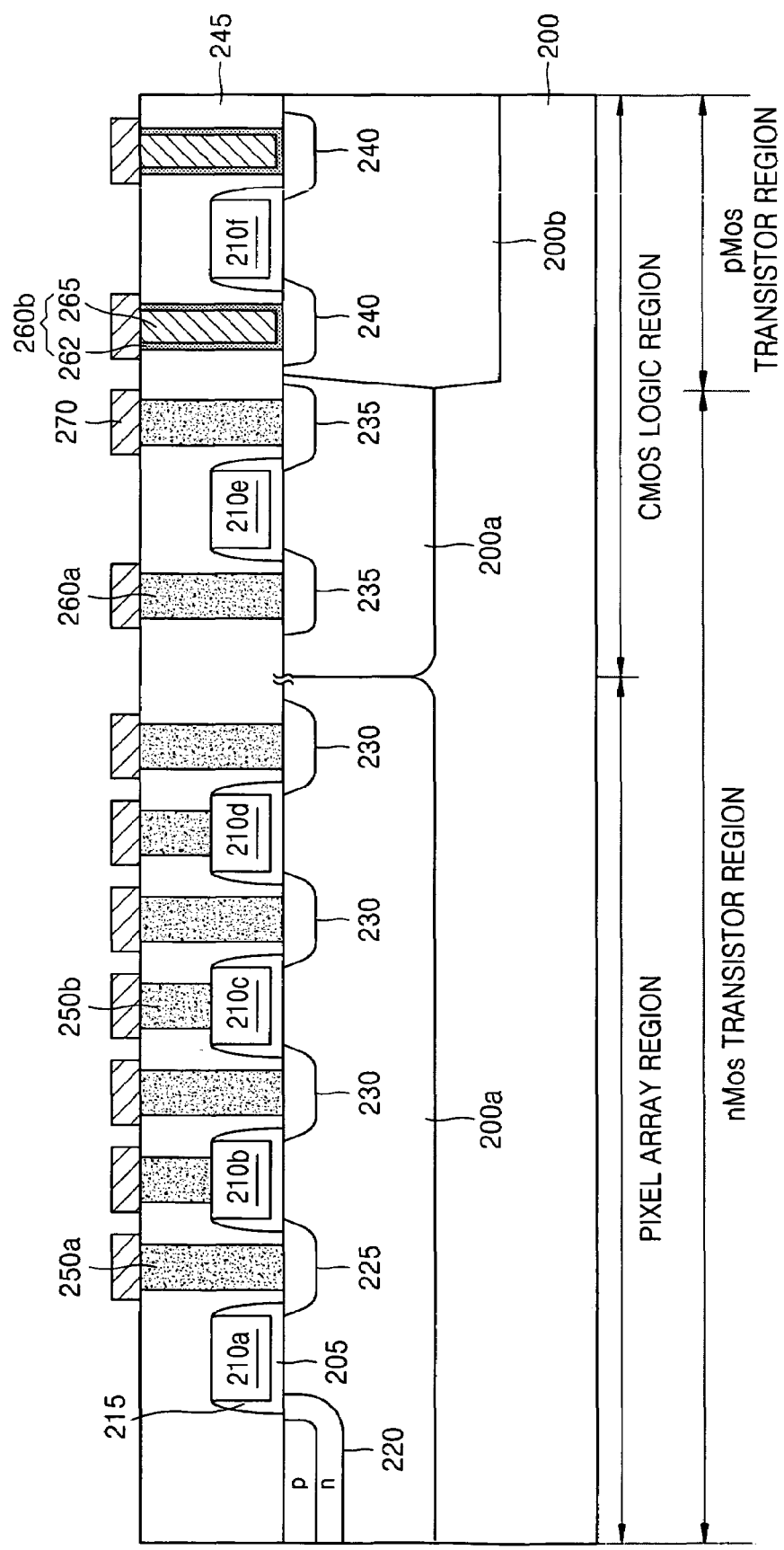

As shown in FIG. 7, each of the contact studs 250a, 250b in the pixel array region, and the contact stud 260a, formed on the junction region 235 of the nMOS transistor in the CMOS logic region, is formed of a doped polysilicon layer. The contact stud 260b formed on the junction region 240 of the pMOS transistor in the CMOS logic region can be formed of a metal.

Figure 8:
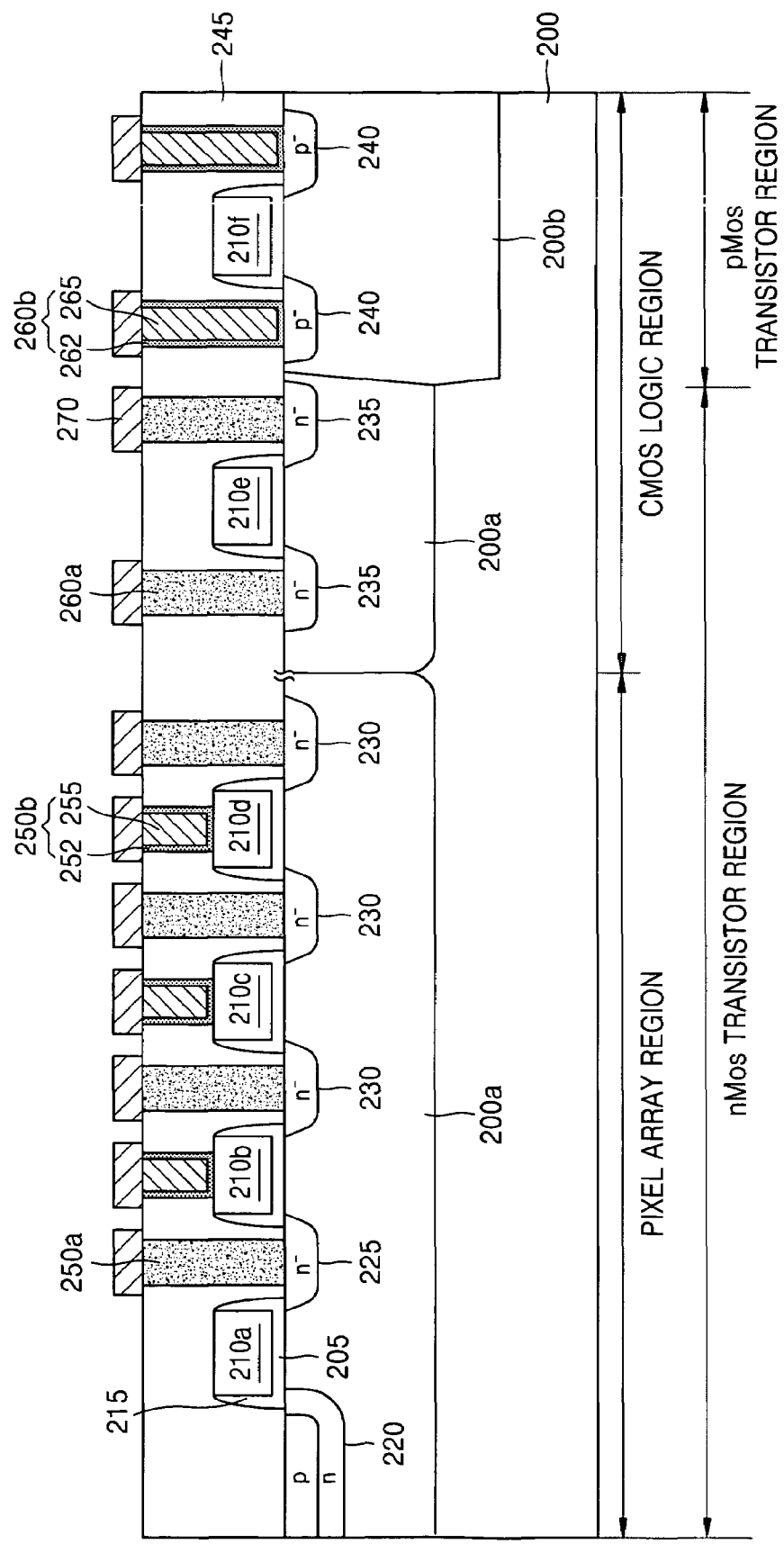

As shown in FIG. 8, the junction regions 230, 235, which contact the impurity-doped polysilicon layer contact studs. The floating diffusion region may be formed of low concentration n-typed impurities. Even though the n-type junction regions 220, 230, 235 are formed of low concentration n-type impurities, since the n-type impurities contact the n-type impurity-doped polysilicon contact studs, an impurity concentration of the junction regions 220, 230, 235 can be compensated.

Figure 9:
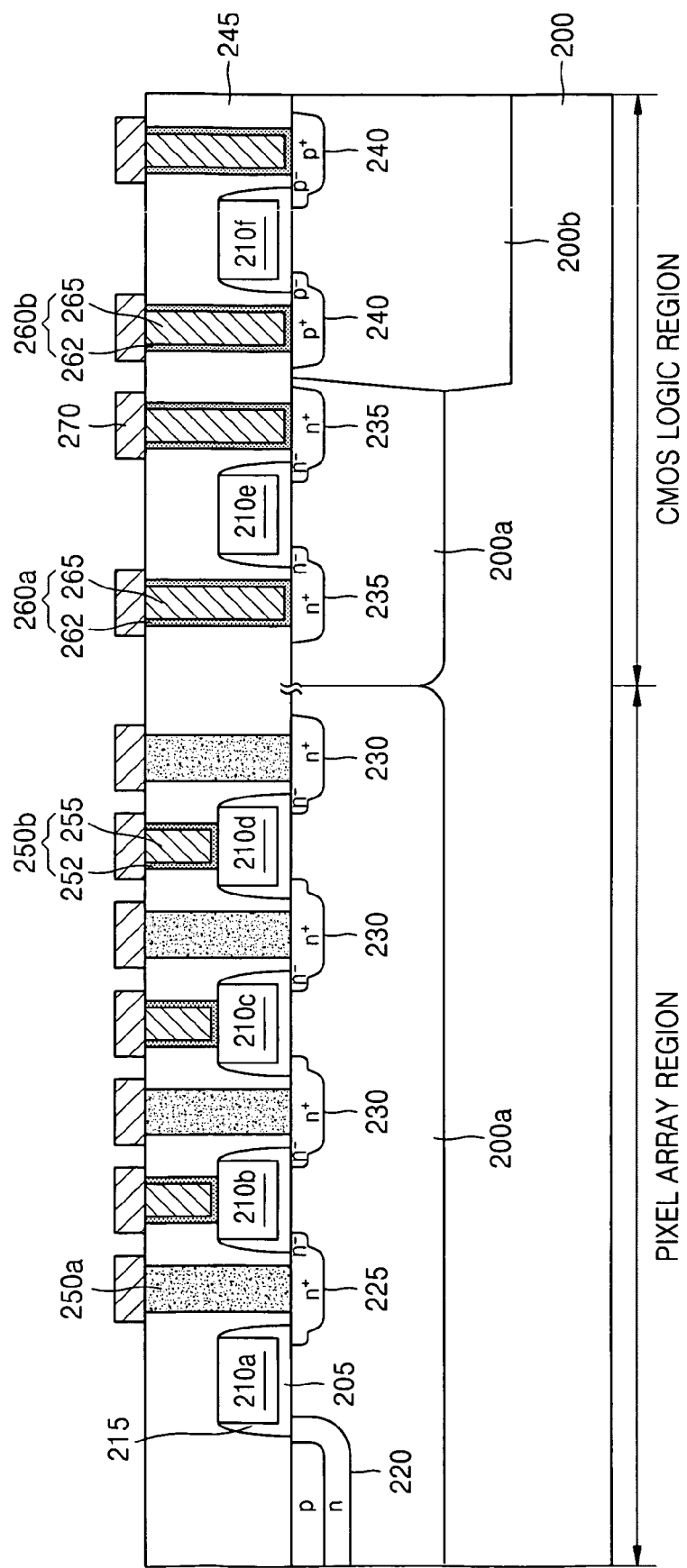

As shown in FIG. 9, the floating diffusion region 225, the junction region 230 of the pixel array region, and the junction regions 235, 240 of the CMOS logic region may have a type of lightly-doped drain (LDD). The LDD includes impurity regions of a high concentration and a low concentration. The structure of FIG. 9 employs, for example, the contact stud structure of FIG. 4. In another exemplary embodiment of the present invention, the structure of FIG. 9 can employ the contact stud structures of FIGS. 5 to 7.

According to exemplary embodiments of the present invention, contact studs in contact with the junction region of the pixel array region and contact studs in contact with the gate electrodes and the junction region of the pixel array region are formed of impurity-doped polysilicon layers. Contact studs in contact with the conductive region of each of the nMOS transistors, including the pixel array region, are formed of impurity-doped polysilicon layers. Contact studs according to exemplary embodiments of the present invention are formed of impurity-doped polysilicon layers to prevent the metal residues, which form the metal studs of the photo diode region, from being remained.

Since properties of doped polysilicon layer are similar to properties of the photo diode region, even though the doped polysilicon layer is formed on the photo diode region, the doped polysilicon layer may not cause a dark defect and a dark noise. Further, since the doped polysilicon contact studs are mostly disposed in the pixel array region, the signal transfer characteristics of the CMOS image device are not significantly affected.

As described above, according to exemplary embodiments of the present invention, the contact stud to be disposed in the region adjacent to the photo diode region is formed of a doped polysilicon layer. Therefore, residues in the photo diode region that may be generated while forming metal studs can be prevented. Therefore, a dark defect and a dark noise of the photo diode can be prevented, thereby improving the image quality of the photo diode.

Although exemplary embodiments have been described herein with reference to the accompanying drawings, it is to be understood that the present invention is not limited to such exemplary embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A CMOS image device comprising:
    a pixel array region including a photo diode region, a floating diffusion region, and at least one MOS transistor having a gate and a junction region;
    a CMOS logic region disposed around the pixel array region, the CMOS logic region including a plurality of transistors having junction regions;
    first contact studs formed on the floating diffusion region and the junction region in the pixel array region; and
    second contact studs formed on the junction regions in the CMOS logic region,
    wherein the first contact studs comprise a different material from at least one of the second contact studs.

2. The CMOS image device of claim 1, wherein the first contact studs comprise impurity-doped polysilicon layers.

3. The CMOS image device of claim 1, wherein the at least one of the second contact studs comprises metal.

4. A CMOS image device comprising:
    a pixel array region including a photo diode region, a floating diffusion region, and at least one MOS transistor having a gate and a junction region;
    a CMOS logic region disposed around the pixel array region, the CMOS logic region including a plurality of nMOS transistors and pMOS transistors;
    contact studs formed on the floating diffusion region and the junction region in the pixel array region, the contact studs comprising impurity-doped polysilicon layers; and
    a contact stud formed on a junction region of one of the pMOS transistors in the CMOS logic region, the contact stud being formed of a metal.

5. A CMOS image device comprising:

a pixel array region including a photo diode region for sensing light, a transfer transistor for transferring charges generated in the photo diode region, a reset transistor for periodically resetting a floating diffusion region storing transferred charges, and a source follower having at least one MOS transistor for buffering a signal according to charges filled in the floating diffusion region;

a CMOS logic region disposed around the pixel array region, the CMOS logic region including nMOS transistors and pMOS transistors;

first contact studs formed on the floating diffusion region, a junction region of the transfer transistor, a junction region of the reset transistor, and a junction region of the MOS transistor of the source follower in the pixel array region, wherein the first contact studs are formed of a doped polysilicon layer; and second contact studs formed on a junction region of the nMOS transistor and a junction region of the pMOS transistor in the CMOS logic region, wherein the second contact studs are formed of a metal.

6. The CMOS image device of claim 5, wherein the floating diffusion region, the junction region of the transfer transistor, the junction region of the reset transistor, and the junction of the MOS transistor of the source follower comprise low concentration n-type impurity regions.

7. The CMOS image device of claim 5, wherein the floating diffusion region, the junction region of the transfer transistor, the junction region of the reset transistor, and the junction of the MOS transistor of the source follower are formed in a type of lightly doped drain including low concentration n-type impurity regions and high concentration n-type impurity regions.

8. The CMOS image device of claim 5, further comprising third contact studs on the gate electrode of the reset transistor and the gate electrode of the MOS transistor of the source follower, wherein the third contact studs are formed of a doped-polysilicon layer.

9. The CMOS image device of claim 5, further comprising third contact studs on the gate electrode of the reset transistor and the gate electrode of the MOS transistor of the source follower, wherein the third contact studs are formed of a metal.

10. The CMOS image device of claim 9, wherein the third contact studs comprise a barrier metal layer including a titanium/titanium nitride layer and a tungsten metal layer.

* * * * *